(12) United States Patent
Chen et al.

(10) Patent No.: US 10,187,059 B2
(45) Date of Patent: Jan. 22, 2019

(54) LIGHT-EMITTING TOUCH-SWITCH DEVICE AND LIGHT-EMITTING TOUCH-SWITCH MODULE

(71) Applicants: LITE-ON OPTO TECHNOLOGY (CHANGZHOU) CO., LTD., Jiangsu Province (CN); LITE-ON TECHNOLOGY CORP., Taipei (TW)

(72) Inventors: Shuo-Hung Chen, Taipei (TW); Chin-Kuan Lin, Taipei (TW)

(73) Assignees: Lite-On Opto Technology (Changzhou) Co., Ltd., Jiangsu Province (CN); Lite-On Technology Corp., Taipei (TW)

( * ) Notice: Subject to any disclaimer, the term of this patent is extended or adjusted under 35 U.S.C. 154(b) by 671 days.

(21) Appl. No.: 14/262,932

(22) Filed: Apr. 28, 2014

(65) Prior Publication Data

US 2014/0340353 A1      Nov. 20, 2014

(30) Foreign Application Priority Data

May 17, 2013   (CN) .......................... 2013 1 0185960

(51) Int. Cl.
  *H03K 17/96*       (2006.01)
(52) U.S. Cl.
  CPC ............... *H03K 17/962* (2013.01); *H03K 2217/960755* (2013.01); *H03K 2217/960785* (2013.01)
(58) Field of Classification Search
  CPC ...... H03K 2217/960755; H03K 17/962; G06F 3/03547; G06F 3/044; G02F 1/13338
  See application file for complete search history.

(56) References Cited

U.S. PATENT DOCUMENTS

| 4,878,107 | A | * | 10/1989 | Hopper | ................ H03K 17/941 |
| | | | | | 257/415 |
| 5,399,820 | A | * | 3/1995 | Silfvast | ................ H01H 13/023 |
| | | | | | 200/314 |
| 6,963,040 | B1 | * | 11/2005 | Urman | ................. H01H 13/023 |
| | | | | | 200/310 |
| 8,552,746 | B2 | | 10/2013 | Pfau et al. | |
| 9,813,059 | B2 | * | 11/2017 | Chu | .................... H03K 17/9622 |
| 2001/0003326 | A1 | * | 6/2001 | Okada | ...................... G01L 5/165 |
| | | | | | 200/516 |
| 2008/0024456 | A1 | * | 1/2008 | Peng | ....................... G06F 3/044 |
| | | | | | 345/173 |

(Continued)

FOREIGN PATENT DOCUMENTS

| GB | 1439166 | * | 6/1976 |
| KR | 20040075479 | * | 3/2006 |

*Primary Examiner* — Anh Mai
*Assistant Examiner* — Fatima Farokhrooz
(74) *Attorney, Agent, or Firm* — Rosenberg, Klein & Lee

(57) ABSTRACT

A light-emitting touch-switch device includes a first circuit board, a cap unit and a light-emitting element. The first circuit board is electrically coupled to a sensing chip. The cap unit is disposed on the first circuit board and that is at least partially made of an electrically conductive plastic material having a resistance of equal to or smaller than $1\times10^5 \Omega$. The cap unit and the first circuit board cooperate to define a receiving space. The light-emitting element is disposed in the receiving space and is electrically coupled to the first circuit board. A light-emitting touch-switch module including the light-emitting touch-switch device is also disclosed.

20 Claims, 16 Drawing Sheets

(56) References Cited

U.S. PATENT DOCUMENTS

| | | | | |
|---|---|---|---|---|
| 2008/0113195 A1* | 5/2008 | Boll | .......................... | C09D 5/24 |
| | | | | 428/401 |
| 2008/0143906 A1* | 6/2008 | Allemand | ............... | B82Y 10/00 |
| | | | | 349/43 |
| 2008/0170372 A1* | 7/2008 | Kirigaya | ................ | H05K 5/065 |
| | | | | 361/720 |
| 2010/0328266 A1* | 12/2010 | Yamauchi | ............ | H03K 17/962 |
| | | | | 345/174 |
| 2011/0140935 A1* | 6/2011 | Anorozo | ............. | H03K 17/962 |
| | | | | 341/33 |
| 2011/0143592 A1* | 6/2011 | Marchetti | ........ | H01R 13/65802 |
| | | | | 439/607.34 |
| 2012/0126834 A1* | 5/2012 | Kleinhans | ............ | H03K 17/962 |
| | | | | 324/658 |
| 2013/0146755 A1* | 6/2013 | Wagner | .................... | B23Q 7/06 |
| | | | | 250/231.13 |
| 2013/0162417 A1* | 6/2013 | Chu | ..................... | H03K 17/962 |
| | | | | 340/407.2 |
| 2013/0162543 A1* | 6/2013 | Behles | ................ | H01L 41/0475 |
| | | | | 345/173 |
| 2013/0292239 A1* | 11/2013 | Hahs | .................... | H03K 17/955 |
| | | | | 200/600 |
| 2013/0334559 A1* | 12/2013 | Vdovin | ................ | H01L 33/507 |
| | | | | 257/98 |
| 2014/0192013 A1* | 7/2014 | Lubert | .................... | G06F 3/044 |
| | | | | 345/174 |
| 2014/0334162 A1* | 11/2014 | Kwon | .................... | F21V 15/01 |
| | | | | 362/362 |
| 2015/0123136 A1* | 5/2015 | Kim | .................... | G02F 1/13454 |
| | | | | 257/72 |
| 2015/0123936 A1* | 5/2015 | Keller | .................. | H03K 17/962 |
| | | | | 345/174 |

\* cited by examiner

LIGHT-EMITTING TOUCH-SWITCH DEVICE AND LIGHT-EMITTING TOUCH-SWITCH MODULE

CROSS-REFERENCE TO RELATED APPLICATION

This application claims priority of Chinese Patent Application No. 201310185960.5, filed on May, 17, 2013.

BACKGROUND OF THE INVENTION

1. Field of the Invention

The invention relates to a touch-switch device and a touch-switch module, more particularly to a light-emitting touch-switch device and a light-emitting touch-switch module.

2. Description of the Related Art

U.S. Pat. No. 7,515,140 discloses a capacitive sensor including a metal spring that defines a central opening, in which a light emitting diode is disposed and serves as an indicator. However, with the spring made from the non-light-transmissive metal, a majority of light emitted from the light emitting diode is blocked, thereby lowering the light-emitting efficiency of the light emitting diode. In addition, the capacitive sensor has a relatively small sensing area.

SUMMARY OF THE INVENTION

Therefore, one object of the present invention is to provide a light-emitting touch-switch device that has a relatively large sensing area and that emits light efficiently.

Another object of the present invention is to provide a light-emitting touch-switch module that has a relatively large sensing area and that emits light efficiently.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
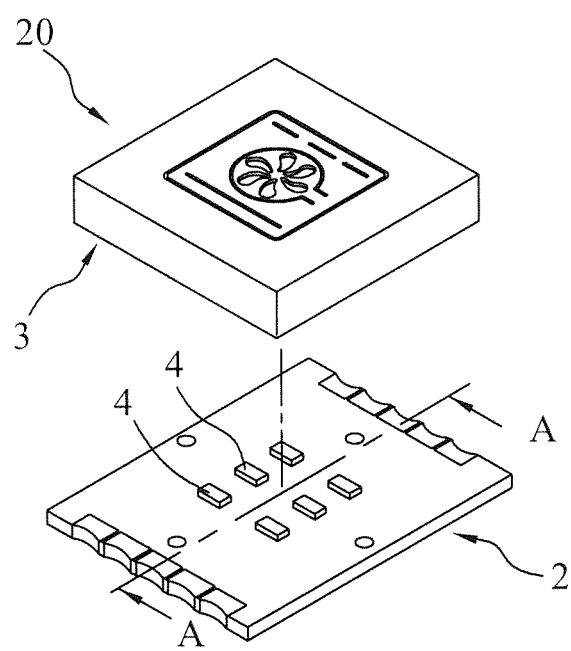
FIG. 1 is a partially-exploded perspective view of a first preferred embodiment of a light-emitting touch-switch device according to the present invention, illustrating light-emitting elements being electrically connected to a first circuit board through SMT (Surface-Mount Technique)

Before the present invention is described in greater detail, it should be noted that like elements are denoted by the same reference numerals throughout the disclosure.

Figure 2:
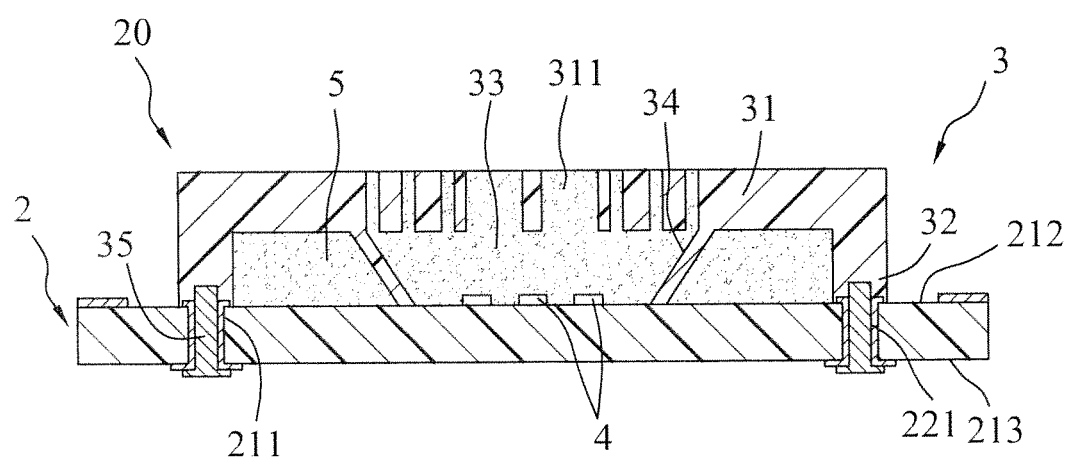
FIG. 2 is a sectional view of the first preferred embodiment of the light-emitting touch-switch device taken along line A-A in FIG. 1.
Figure 3:
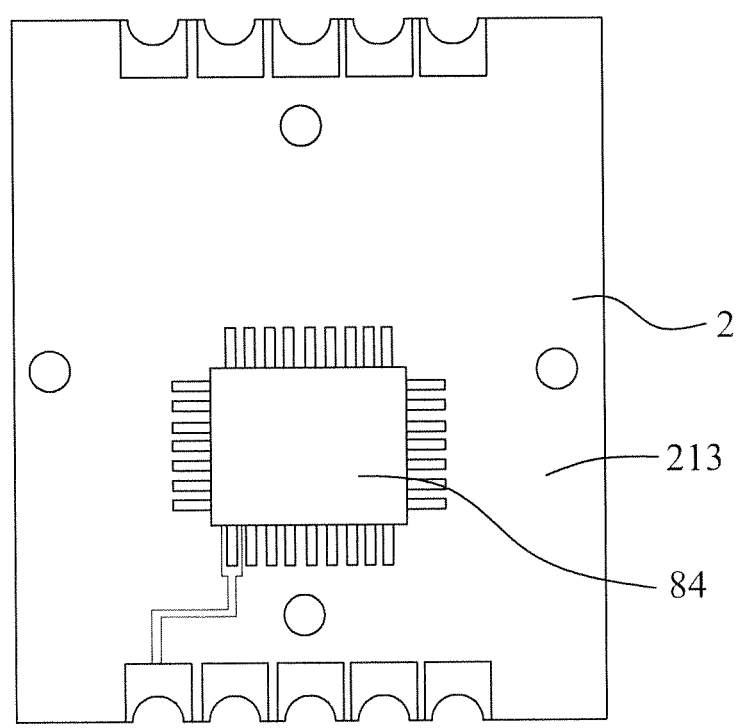
FIG. 3 is a bottom view of the first preferred embodiment of the light-emitting touch-switch device, illustrating that a sensing chip is disposed on a bottom surface of the first circuit board.

Referring to FIGS. 1 to 3, the first preferred embodiment of a light-emitting touch-switch device 20 is shown to be adapted for use with a sensing chip 84 (see FIG. 3). The sensing chip 84 generates a touch-sensing signal as a result of an electrically conductive object (e.g., a finger) being disposed in proximity of or in contact with the light-emitting touch-switch device 20. The touch-sensing signal may be used for actuating an external electronic appliance.

The first preferred embodiment of the light-emitting touch-switch device 20 includes a first circuit board 2, a cap unit 3 and a plurality of light emitting elements 4.

The first circuit board 2 has a top surface 212, a bottom surface 213, and is formed with at least one through hole 211 where a metal layer 221 is disposed therein. In greater detail, the metal layer 221 has a portion that is formed in the through hole 211 and that covers a hole-defining surface defining the through hole 211, and further has portions adhered respectively to the top and bottom surfaces 212,213 of the first circuit board 2. The metal layer 221 is substantially made of copper and is disposed onto the hole-defining surface in such a manner as to not block the through hole 211 entirely. In this embodiment, the first circuit board 2 is a printed circuit board.

The cap unit 3, which is made of a light-reflective material, is disposed on and electrically coupled to the first circuit board 2, and includes a frame segment 32 that is made of an electrically conductive plastic material. In order to be effectively applied into touch-switch devices, the resistance of the frame segment 32 needs to be equal to or smaller than $1 \times 10^5 \Omega$, preferably ranging from $1.5 \times 10^2 \Omega$ to $2.1 \times 10^3 \Omega$. The frame segment 32 is in the form of a surrounding wall in this embodiment. The cap unit 3 further includes a covering segment 31 that is connected to the frame segment 32. In this embodiment, the covering segment 31 is made of the same material as the frame segment 32, and the cap unit 3 is integrally formed as one piece. The cap unit 3 cooperates with the first circuit board 2 to define a receiving space 33. In this embodiment, the frame segment 32 is electrically and physically coupled to the first circuit board 2 by having a pin 35 inserted into the through hole 211. The metal layer 221 formed on the hole-defining surface is electrically connected to the pin 35 so as to ensure the electrical connection between the pin 35 and the first circuit board 2. The pin 35 is made of a metallic material, such as copper. Preferably, the pin 35 is substantially made of copper and is coated with a steel layer.

The light-emitting elements 4 are disposed in the receiving space 33 and are electrically coupled to the first circuit board 2. The light-emitting elements 4 emit light toward a direction that is away from the first circuit board 2 upon receipt of the touch-sensing signal. In this preferred embodiment, six light-emitting elements 4 are present, but the light-emitting touch-switch device 20 of the present invention may only include a single light-emitting element 4 as required by a practice demand. Since the cap unit 3 is made of the light-reflective material, the light emitted from the light-emitting element 4 can be reflected by the cap unit 3. Light-emitting efficiency of light-emitting touch switch device 20 can thereby be enhanced by the cap unit 3.

The covering segment 31 has a light-transmissive pattern area 311 that is located above the light-emitting elements 4 for permitting the light emitted from the light emitting elements 4 to pass therethrough, so that the light-emitting touch-switch device 20 may serve as a patterned button for physical touch by operators. In addition, the light emitted from the light-emitting element 4 can pass through the light-transmissive pattern area 311 of the covering segment 31, such that the patterned button can serve as an indicator for easy operation.

When an electrically conductive object is disposed in proximity of or in contact with the frame segment 32 of the cap unit 3, the sensing chip 84 detects variation of capacitance of the frame segment 32 and generates the touch-sensing signal, which is then transmitted to the light-emitting elements 4 so as to drive the light-emitting elements 4 to emit the light. Essentially, the touch-sensing signal triggers the change of the state of the light-emitting elements 4, such as, from an "OFF" state to an "ON" state.

In this embodiment, the touch-sensing signal comes from detection of the variation of capacitance of the frame segment 32 of the cap unit 3. According to the following formula for measuring capacitance between two electrodes of a capacitor:

$$C = \in A/d$$

$\in$ represents a dielectric constant of a medium between the electrodes, A represents an area of the electrodes and d represents the distance between the electrodes. In case of the light-emitting touch-switch device 20 of the present invention, where the electrically conductive object and the frame segment 32 of the cap unit 3 serve as the electrodes, d may be much smaller in comparison to conventional touch-switch devices. To be specific, since the cap unit 3 is made of the electrically conducting plastic material, the top surface of the frame segment 32 can serve as one of the electrodes of the capacitor. The electrically conductive object can serve as the other one of electrodes of the capacitor. Therefore, the distance d between the electrodes is relatively reduced. On the other hand, in the conventional touch-switch devices, a sensing pad is usually disposed on a circuit board and is not located on the top surface of the frame segment of the cap unit. Thus, the distance d between the electrodes of the equivalent capacitor for the conventional touch-switch devices would be relatively large and the intensity of the touch-sensing signal is weaker when compared to the present invention. In other words, the intensity of the sensed variation of the capacitance of the cap unit 3 of the light-emitting touch-switch device according to the present invention is enhanced to result in an enhanced touch-sensing signal. Besides, by using various electrically conductive plastic materials, the dielectric constant can be altered so as to further enhance the touch-sensing signal.

In greater detail, the cap unit 3 of this embodiment is formed by injection molding using the electrically conductive plastic material. The electrically conductive plastic material may be composed of a conventional polymeric material (such as PC and PA) blended with micron-sized metallic fibers or particles, or of a polymeric material that is self-conductive due to the predetermined bonding structure of its molecular segments. In this embodiment, the electrically conductive plastic material is made of polycarbonate resin blended with 10 Wt % of stainless steel fibers.

Other than inserting the pin 35, it is worth noting that the frame segment 32 of the cap unit 3 may have an extending portion engaging the through hole 211 by way of interference fit, hot pressing, or cold pressing. Preferably, in order to condense the light emitted from the light-emitting elements 4, the cap unit 3 may further have an interior wall 34 that extends from the covering segment 31 toward the first circuit board 2, that confines a space within the receiving space 33, and that surrounds the light-emitting elements 4 so as to further condense the light emitted from the light-emitting elements 4 to pass through the light-transmissive pattern area 311 of the covering segment 34. Especially, an inclined angle defined by the interior wall 34 and the first circuit board 2 is capable of further condensing light emitting from the light-emitting elements 4. In this embodiment, the interior wall 34 is also made of the electrically conductive plastic material, and extends toward and is electrically coupled to the first circuit board 2, thereby also serving to enhance the sensitivity of a sensing mechanism constituted by the frame segment 32 and the sensing chip 84.

In this embodiment, the light-emitting touch-switch device 20 may further include an encapsulation resin 5 filling in the receiving space 33 to encapsulate the light emitting elements 4. The encapsulation resin 5 may increase the combination strength between the cap unit 3 and the first circuit board 2, as well as diffusing and well-mixing the light emitted from the light-emitting elements 4.

The cap unit 3 of this embodiment is free from oxidation caused by moisture and requires no conventional cover since the cap unit 3 of the present invention is made of the electrically conductive plastic material. On the contrary, since the sensing pad for the conventional touch-switch devices is usually made of metal, the sensing pad is easily oxidized by moisture. Moreover, since the cap unit 3 of the present invention is electrically conductive, the touch-sensing area can thereby extend to the whole surface of the cap unit 3.

As shown in FIG. 3, the sensing chip 84 is disposed on the bottom surface 213 of the first circuit board 2 in this embodiment. However, the sensing chip 84 may be disposed on the top surface 212 (see FIG. 2) of the first circuit board 2 so long as the sensing chip 84 is electrically coupled to the frame segment 32 of the cap unit 3 to cooperatively form the touch-sensing mechanism.

Figure 4:
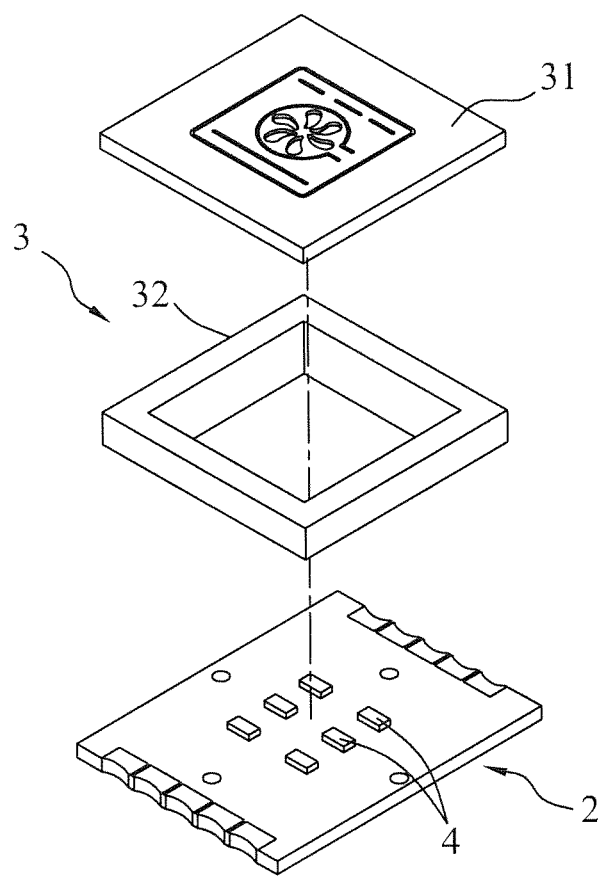
FIG. 4 is a partially-exploded perspective view of a second preferred embodiment of the light-emitting touch-switch device according to the present invention.
Figure 5:
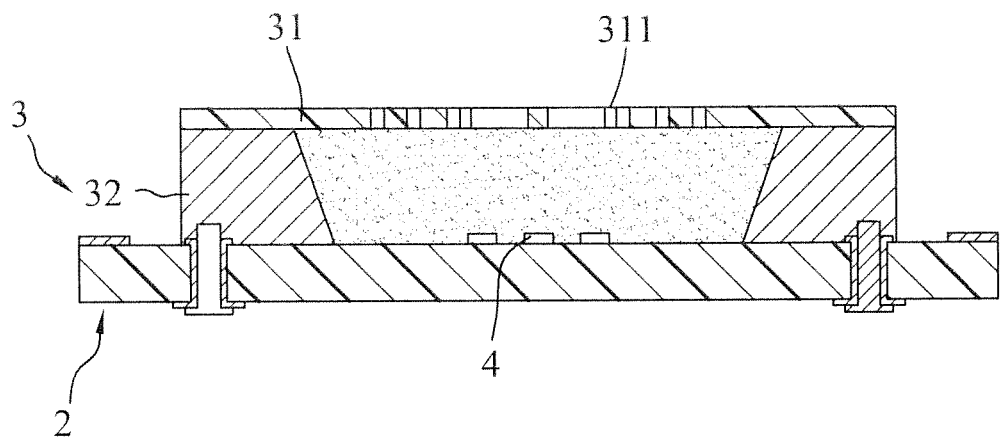
FIG. 5 is a sectional view of the second preferred embodiment of the light-emitting touch-switch device.

Referring to FIGS. 4 and 5, the second preferred embodiment of the light-emitting touch-switch device 20 is shown to be similar to that of the first preferred embodiment. The difference therebetween resides in that the frame segment 32, which is in the form of a surrounding wall, and the covering segment 31 are separate pieces.

In addition, in another embodiment, the covering segment 31 is made of a material different from that of the frame segment 32, and may be a plastic or metallic plate, such that the covering segment 31 can be easily replaced so as to acquire various patterns on the top surface of the cap unit 3.

In the second preferred embodiment, since the cap unit 3 is formed by two separable elements, there is no need to redesign the molding equipment for the whole cap unit 3. Therefore, the manufacturing cost can be reduced in the second preferred embodiment of the light-emitting touch-switch device 20.

It should be noted that, the cap unit 3 has a minimum length of 1 mm, a minimum width of 1 mm, and a minimum height of 0.5 mm to insure that the cap unit 3 can sense the physical contact of the electrically conductive object. It should be also noted that the there is no limitation on a maximum size for the cap unit 3.

Figure 6:
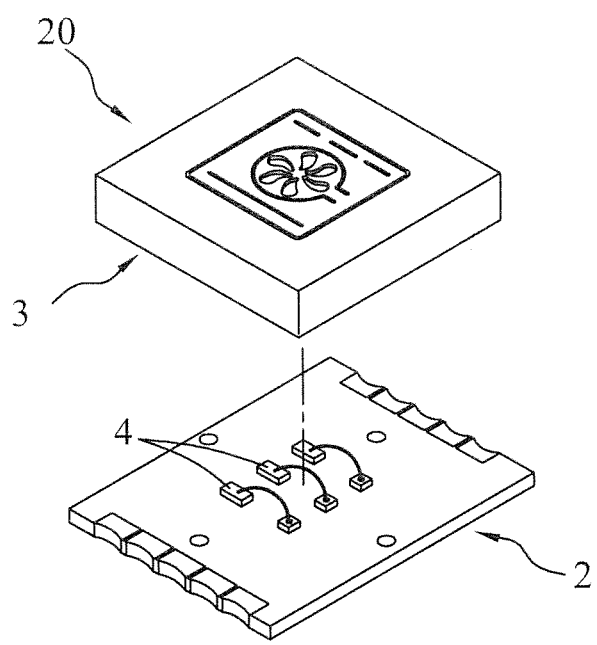
FIG. 6 is a partially-exploded perspective view of a variation of the first preferred embodiment of the light-emitting touch-switch device, illustrating the light-emitting elements being electrically connected to the first circuit board by wire bonding.
Figure 7:
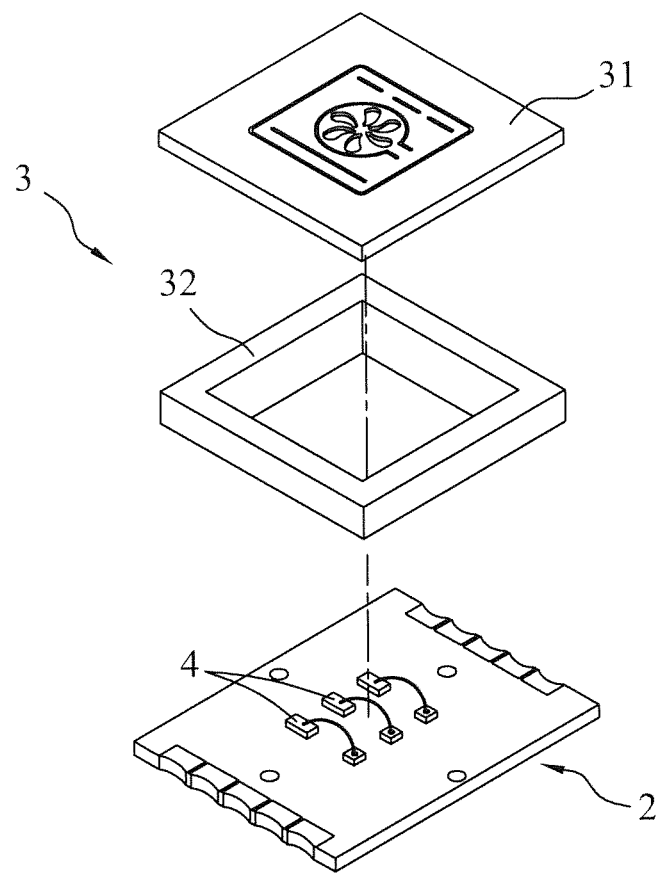
FIG. 7 is a partially-exploded perspective view of a variation of the second preferred embodiment of the light-emitting touch-switch device, illustrating the light-emitting elements being electrically connected to the first circuit board by wire bonding.

Specifically, the light-emitting elements 4 can be LED dies or LED packages. As shown in FIGS. 1 and 4, when the light-emitting elements 4 are LED packages, they can be electrically coupled to the first circuit board 2 utilizing Surface Mounted Technology (SMT). Referring to FIGS. 6 and 7, when the light-emitting elements 4 are LED dies, they can be electrically coupled to the first circuit board 2 by wire bonding.

Figure 8A:
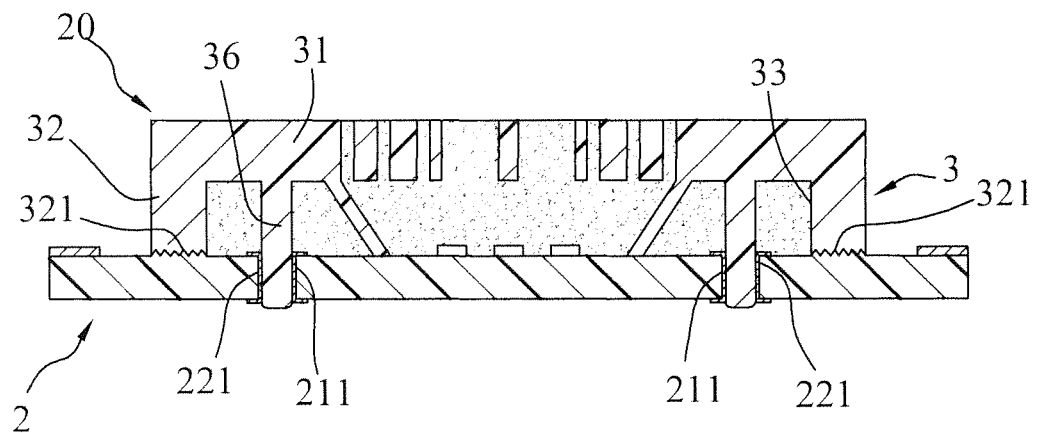
FIG. 8a is a sectional view of a third preferred embodiment of the light-emitting touch-switch device according to the present invention, illustrating that first extending portions of a cap unit respectively engage through holes in the first circuit board by interference fit.

Referring to FIG. 8a, the third preferred embodiment of the light-emitting touch-switch device 20 according to the present invention is shown to be similar to the first preferred embodiment. The difference therebetween resides in that the frame segment 32 of the cap unit 3 is connected to the first circuit board 2 by way of physical contact with surface roughness, and that further includes at least one first extending portion 36 extending from the covering segment 31 toward the first circuit board 2 and being connected to the first circuit board 2. To be more specific, in this embodiment, the frame segment 32 has a rough bottom surface 321 physically contacting and electrically connected to the first circuit board 2 so as to increase the contact area between the first circuit board 2 and the frame segment 32, and to lower the ohmic contact resistance generated therebetween. In this embodiment, the first extending portion 36 is disposed within the receiving space 33. In detail, the first extending portion 36 is disposed between the frame segment 32 and the interior wall 34.

Figure 8B:
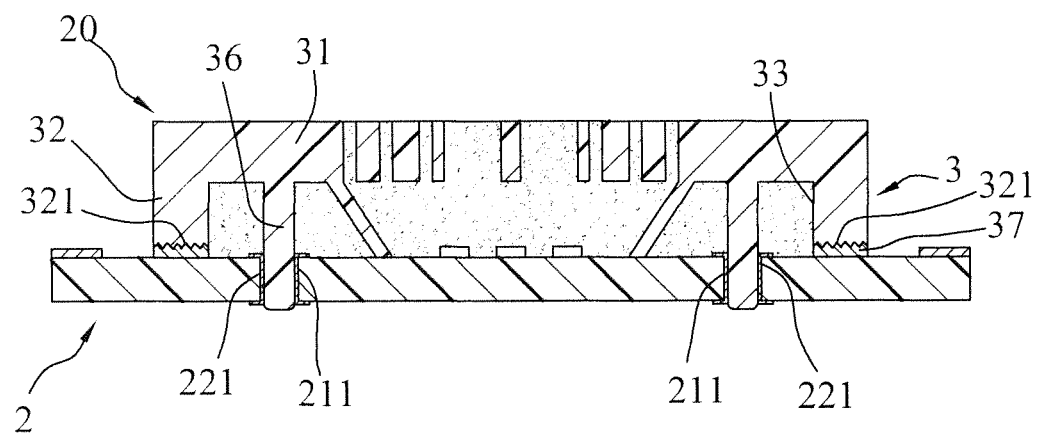
FIG. 8b is similar to FIG. 8a for illustrating an alternative configuration of the third preferred embodiment.

Referring to FIG. 8b, in an alternative configuration of the third preferred embodiment, the light-emitting touch-switch device 20 further includes an electrically-conductive layer 37 interposed between the rough bottom surface 321 of the frame segment 32 and the top surface 213 of the first circuit board 2 to further enhance the sensitivity of the light-emitting touch-switch device. In this embodiment, the electrically-conductive layer 37 is substantially made of a metallic material.

In this embodiment, the first extending portion 36 of the cap unit 3 is coupled to the first circuit board 2 by way of interference fit, where the first extending portion 36 is inserted into a through hole 211 penetrating the first circuit board 2 to contact electrically a metal layer 221 formed on a hole-defining surface that defines the through hole 211, so as to enhance the electrical connection between the first circuit board 2 and the cap unit 3.

Figure 9:
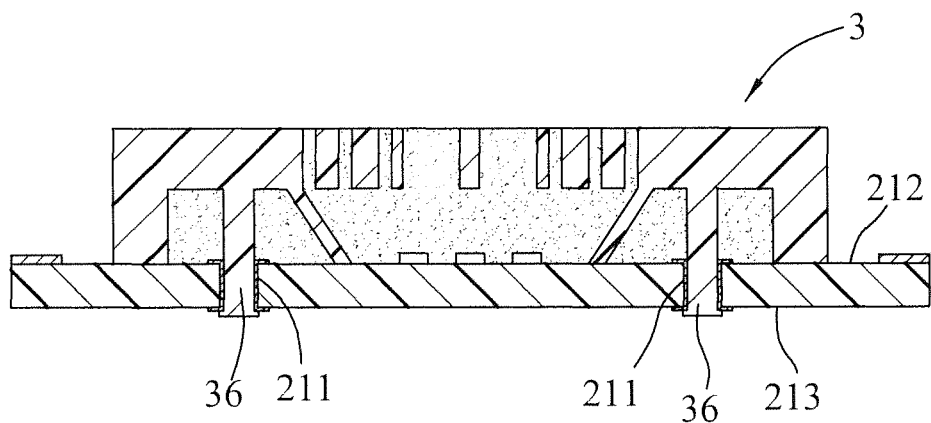
FIG. 9 is a sectional view of a variation of the third preferred embodiment of the light-emitting touch-switch device, illustrating that the first extending portions respectively engage the through holes by hot pressing or cold pressing, and that the first extending portions protrude from the bottom surface of the first circuit board.
Figure 10:
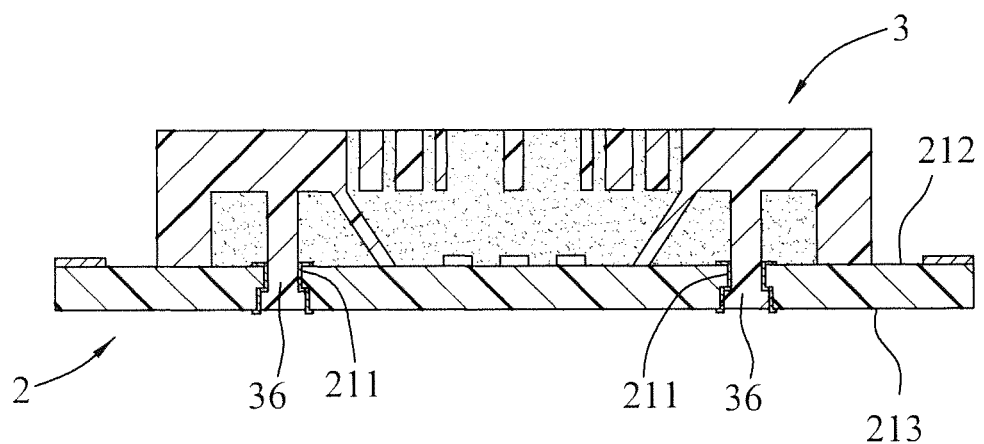
FIG. 10 is a sectional view of another variation of the third preferred embodiment of the light-emitting touch-switch device, illustrating that the first extending portions respectively engage the through holes by hot pressing or cold pressing, and that the first extending portions are flush with the bottom surface of the first circuit board.

Referring to FIGS. 9 and 10, the first extending portion 36 of the cap unit 3 may also engage the though hole 211 by way of hot pressing or cold pressing.

In addition, there may be multiple sets of the first extending portions 36, the through holes 211 and the metal layers 221 in other embodiments of this invention. It is worth noting that, as shown in FIG. 10, the through hole 211 may be a stepped hole for increasing the contact area between the metal layer 221 and the first extending portion 36, preferably stepping at a height ranging from one-third to one-half of the thickness of the first circuit board 2 (from the bottom surface 213). Therefore, the capacity of touch-sensing signal for the light-emitting touch-switch device can be enhanced by increasing the contact area between the metal layer 221 and the first extending portion 36. Further, the first extending portion 36 may protrude from (see FIG. 9) or be flush with (see FIG. 10) the bottom surface 213 of the first circuit board 2 when engaging the through hole 211. As with the first preferred embodiment, the metal layer 221 may extend to the top and bottom surfaces 212, 213 of the first circuit board 2.

Figure 11:
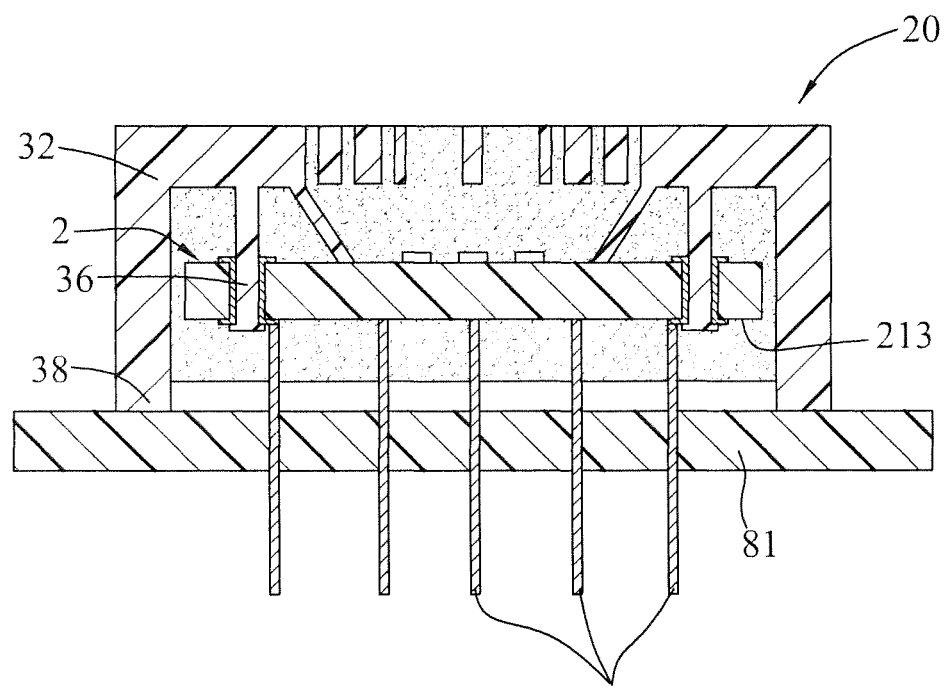
FIG. 11 is a sectional view of a fourth preferred embodiment of the light-emitting touch-switch device according to the present invention, illustrating that the light-emitting touch-switch device is connected to a second circuit board by supplemental pins.

Referring to FIG. 11, the fourth preferred embodiment of the light-emitting touch-switch device 20 according to the present invention is shown to be similar to that of the third preferred embodiment. The difference therebetween resides in that the fourth preferred embodiment of the light-emitting touch-switch device 20 further includes a plurality of supplemental pins 7 connected to the first circuit board 2 and adapted for engaging a second circuit board 81 of the light-emitting touch-switch module, and that the frame segment 32 of the cap unit 3 has a second extending portion 38 that is adapted to extend toward and to be connected to the second circuit board 81.

In greater detail, the second extending portion 38 of the frame segment 32 extends to reach a top surface of the second circuit board 81, and the supplemental pins 7 extend toward and penetrate the second circuit board 81 so as to protrude from a bottom surface of the second circuit board 81. By utilizing the supplemental pins 7, the fourth preferred embodiment of the light-emitting touch switch device 20 can be removably engaged with the second circuit board 81 with a plugging/unplugging movement.

Figure 12:
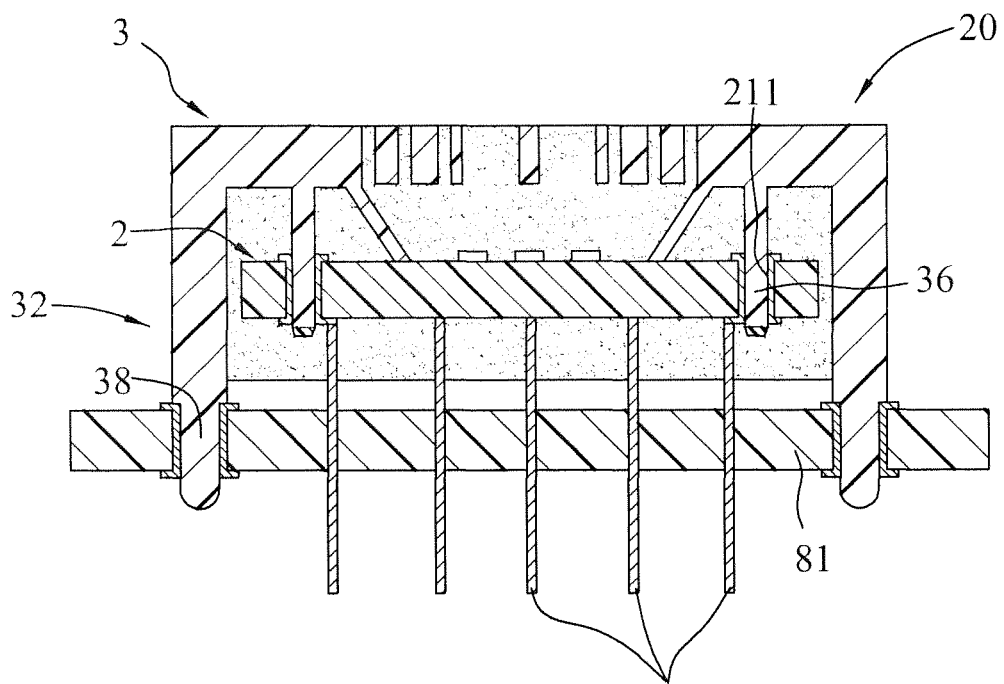
FIG. 12 is a sectional view of a variation of the fourth preferred embodiment of the light-emitting touch-switch device.

Further referring to FIG. 12, the first extending portion 36 engages the through hole 211 of the first circuit board 2 by way of interference fit, and the second extending portion 38 also engages the second circuit board 81 by way of interference fit so as to improve the structural strength of the light-emitting touch-switch device 20 when the light-emitting touch-switch device 20 is connected to the second circuit board 81 with the supplemental pins 7.

Figure 13:
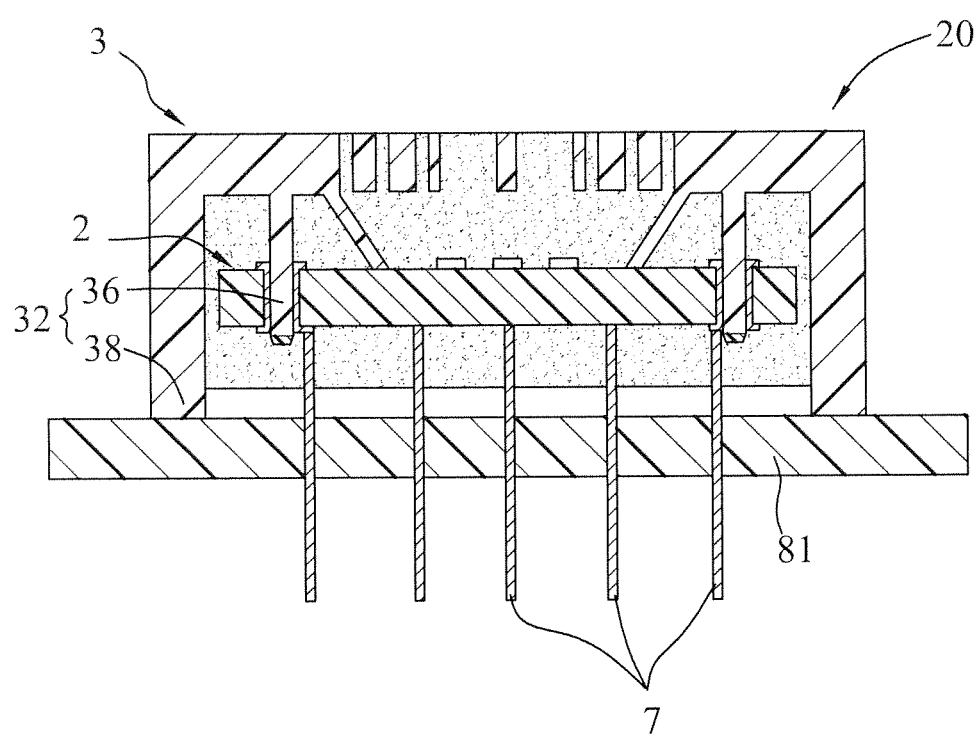
FIG. 13 is a sectional view of another variation of the fourth preferred embodiment of the light-emitting touch-switch device.

FIG. 13 is a variation of FIG. 11, in which the first extending portion 36 engages the first circuit board 2 by interference fit. The second extending portion 38 is disposed on a top surface of the second circuit board 81 so as to improve the structural strength of the light-emitting touch-switch device 20 when the light-emitting touch-switch device 20 is connected to the second circuit board 81 by the supplemental pins 7.

To sum up, the first and second extending portions 36, 38 of the cap unit 3 can respectively engage and electrically couple to the first and second circuit boards 2, 81 by way of one of interference fit, hot pressing, and cold pressing, and the frame segment 32 of the cap unit 3 may also be connected to the first circuit board 2 by way of inserting metal pins or physical contact with surface roughness.

Figure 14:
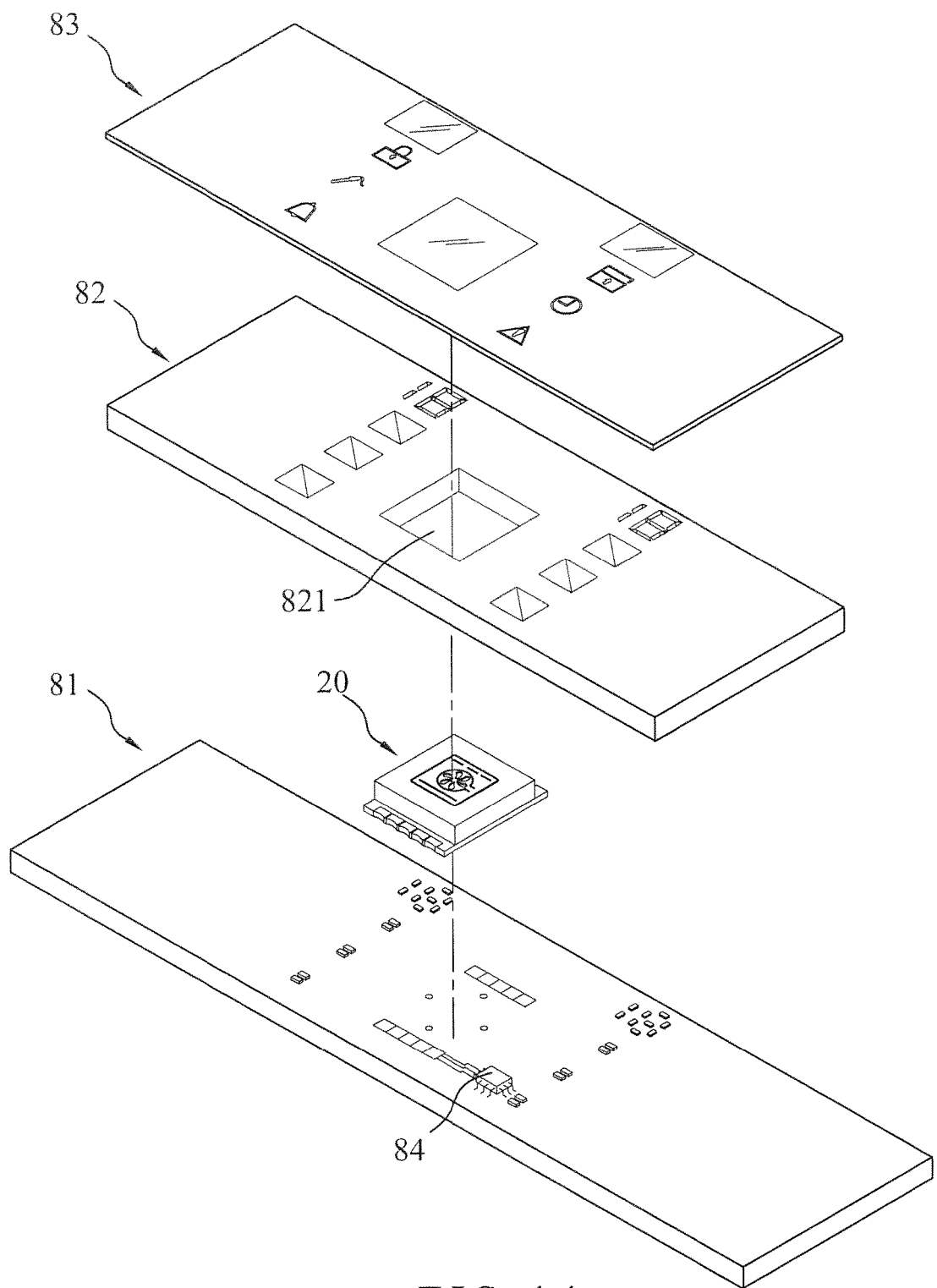
FIG. 14 is a partially-exploded perspective view of a first preferred embodiment of a light-emitting touch-switch module according to the present invention.
Figure 15:
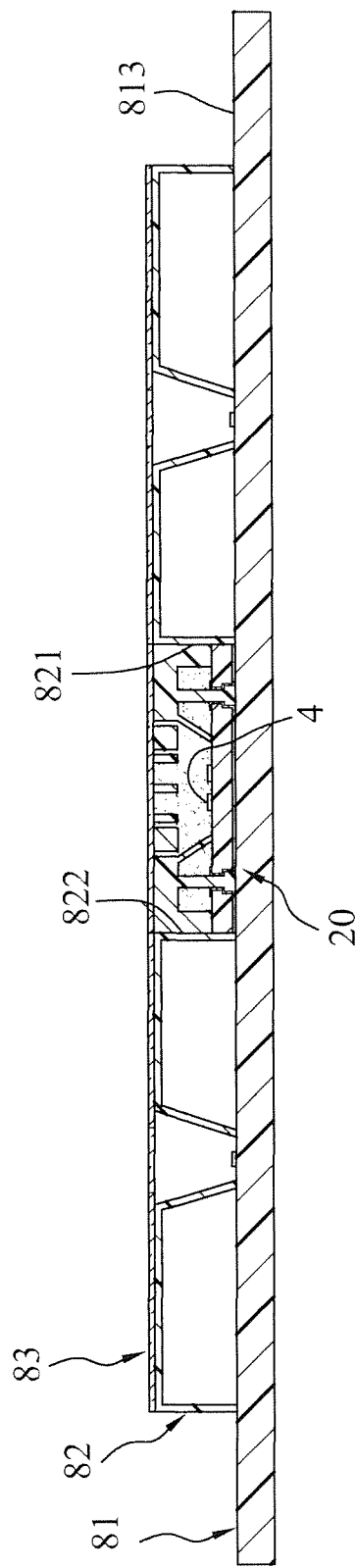
FIG. 15 is a sectional view of the first preferred embodiment of the light-emitting touch-switch module.

Referring to FIGS. 14 and 15, the first preferred embodiment of the light-emitting touch-switch module is adapted to be electrically coupled to an electronic appliance (not shown) and generates a sensing signal as a result of an electrically conductive object being disposed in proximity of or in contact therewith. The light-emitting touch-switch module includes the light-emitting touch-switch device 20 including the cap unit 3 and the first circuit board 2 (see FIGS. 1~13 for details and variations), a second circuit board 81, a sensing chip 84, a receiving element 82 and a cover 83. In this embodiment, the sensing chip 84 is disposed on a top surface 813 of the second circuit board 81.

The receiving element 82 is disposed on the top surface 813 of the second circuit board 81 and interconnects the second circuit board 81 and the cover 83. The receiving element 82 is formed with a through hole 821, and cooperates with the second circuit board to define a device-receiving space 822. The light-emitting touch-switch device 20 is received in the device-receiving space 822 and electrically coupled to the sensing chip 84. The receiving element 82 can protect the light-emitting touch-switch device 20 from damages at lateral sides. The receiving element 82 is made from a light-reflective material.

The cover 83 is disposed on the receiving element 82 and above the second circuit board 81, and is provided with light-transmissive patterns for permitting light emitted from the light-emitting elements 4 of the light-emitting touch-switch device 20 or other light-emitting components located on the second circuit board 81 to pass therethrough. Further, the cover 83 is water-resistant and is capable of preventing components disposed therebelow from scratches. In this embodiment, the cover 83 is made of a plastic material.

The sensing chip 84 is electrically coupled to the frame segment 32 of the cap unit 3 of the light-emitting touch-switch device 20 and generates a sensing signal when the sensing chip 84 detects variation of the capacitance of the frame segment 32, such that the light emitting elements 4 emits light upon receipt of the sensing signal from the sensing chip 89. An external electronic appliance may further be controlled to be switchable between an ON-state and an OFF-state by the sensing signal of the sensing chip 84.

Figure 16:
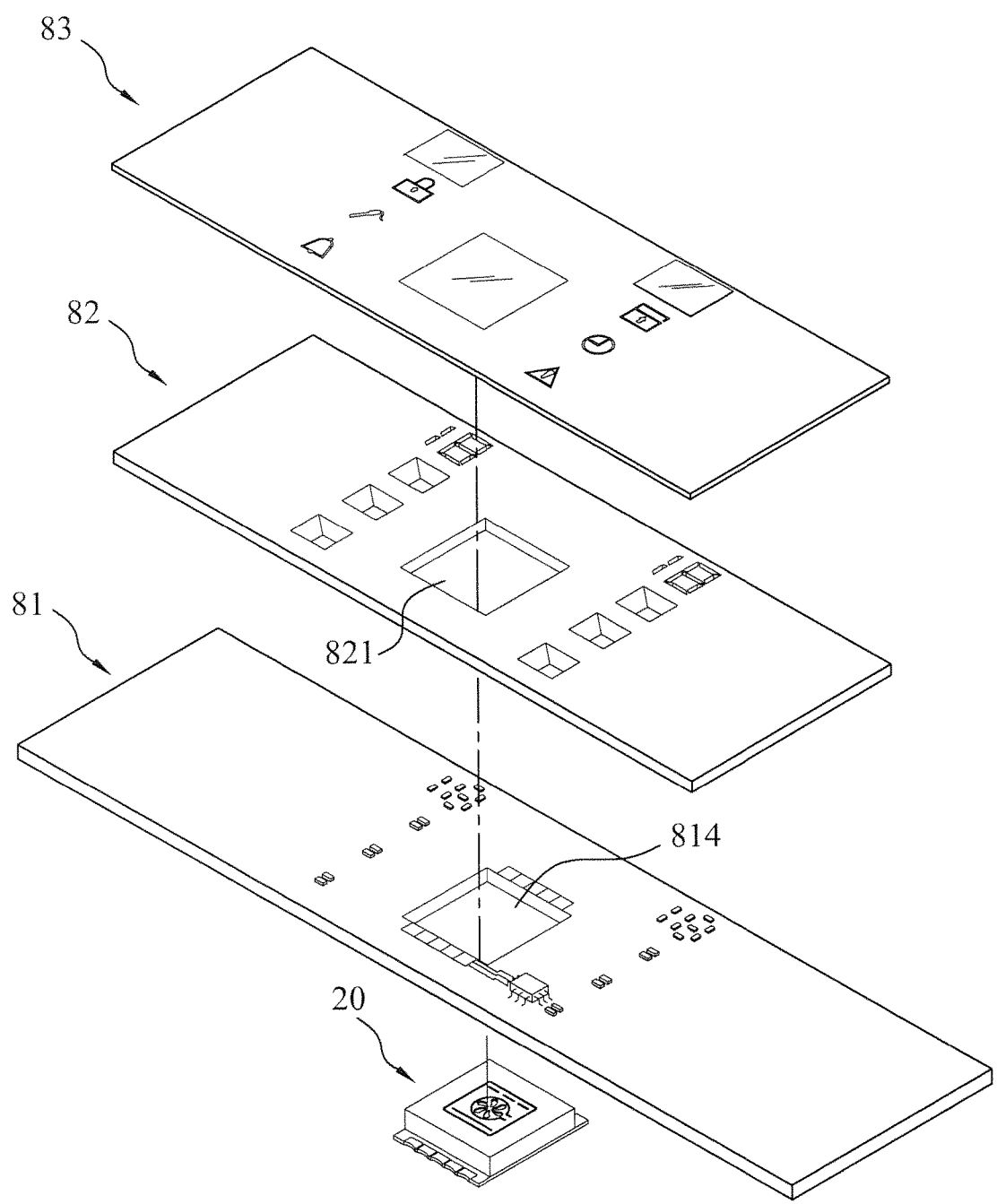
FIG. 16 is a partially-exploded perspective view of a second preferred embodiment of the light-emitting touch-switch module according to the present invention.
Figure 17:
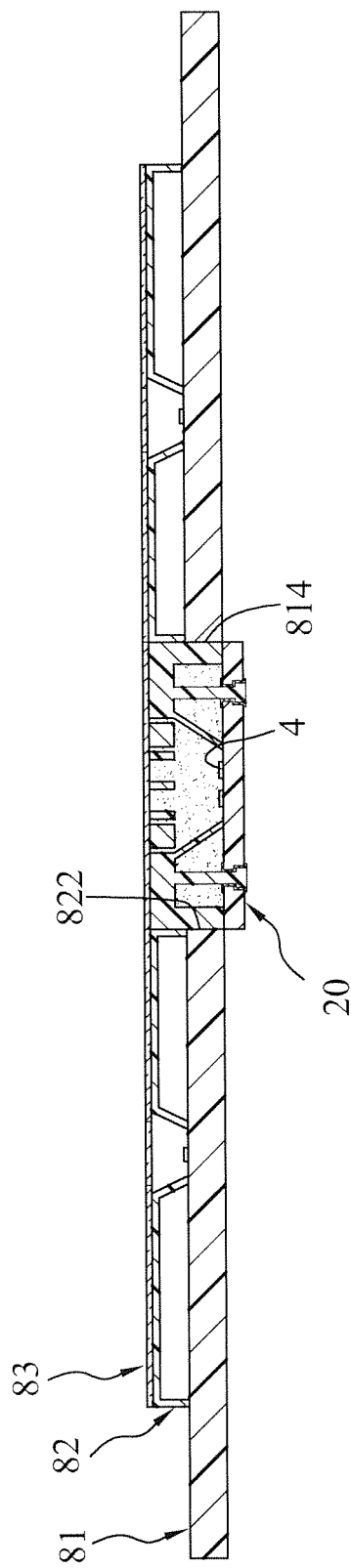
FIG. 17 is a sectional view of the second preferred embodiment of the light-emitting touch-switch module.

Referring to FIGS. 16 and 17, the second preferred embodiment of the light-emitting touch-switch module is shown to be similar to the first preferred embodiment. The difference therebetween resides in that the second circuit board 81 is formed therethrough with an opening 819 that is registered with the through hole 821 in the receiving element 82 and that cooperates with the through hole 821 to define the device-receiving space 822, such that the light-emitting touch-switch device 20 is at least partially received in the device-receiving space 822 (i.e., the opening 814 and the through hole 821) by inserting from the bottom side of the second circuit board 81. In this embodiment, the light-emitting touch-switch device 20, except for the first circuit board 2, is received in the device-receiving space 822 so as to provide a streamlined and smooth appearance.

Figure 18:
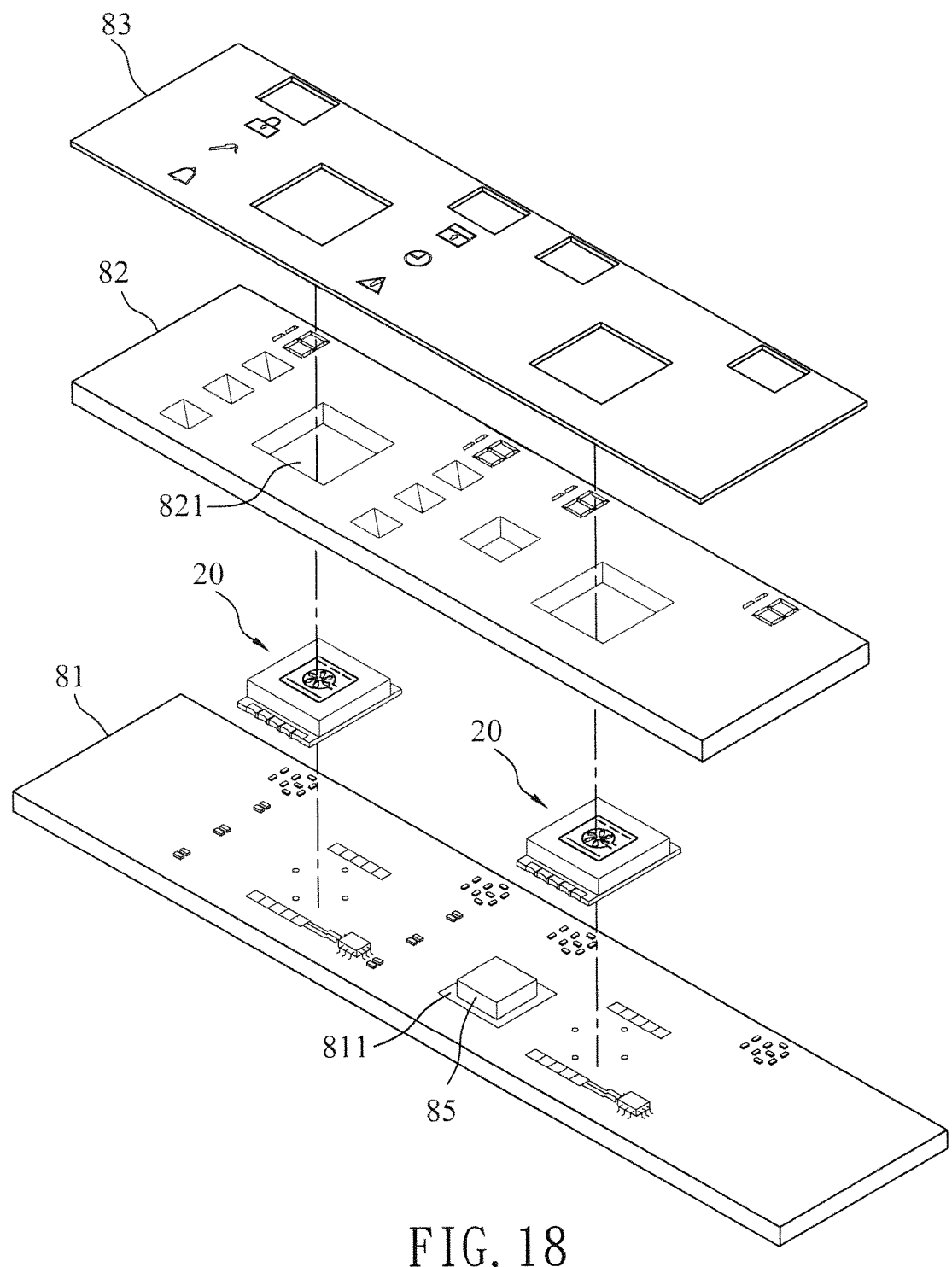
FIG. 18 is a partially-exploded perspective view of a third preferred embodiment of the light-emitting touch-switch module according to the present invention.
Figure 19:
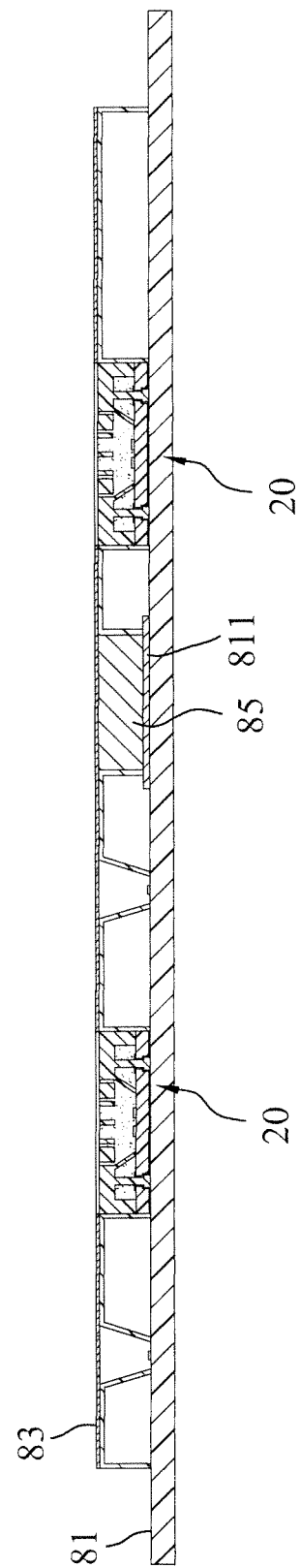
FIG. 19 is a sectional view of the third preferred embodiment of the light-emitting touch-switch module.

Referring to FIGS. 18 and 19, the third preferred embodiment of the light-emitting touch-switch module is shown to be similar to the first preferred embodiment. The differences therebetween are described in the following. The second preferred embodiment of the light-emitting touch-switch module includes a plurality of the light-emitting touch-switch devices 20, and the cover 83 is made of an electrically-conductive material. The light-emitting touch-switch module further includes a grounding element 85 that is disposed on a metal pad 811 of the second circuit board 81 and that is electrically coupled to the cover 83, such that the grounding element 85 together with the metal pad 811 and the cover 83 forms a grounding circuit.

In this embodiment, the cover 83 is grounded due to existence of the grounding element 85, such that each of the light-emitting touch-switch devices 20 can be operated independently without being interfered by the touch-sensing signal or electrical signals generated from the other light-emitting touch-switch device 20 adjacent thereto. Further, the grounding element 85 prevents short-circuit of the cover 83 when the cover 83 is made of an electrically-conductive material.

To sum up, the frame segment 32 of the cap unit 3 of the present invention, which is made of the electrically conductive plastic material by injection molding, is free from oxidation caused by moisture and requires no conventional cover. Further, the touch-sensing area is enlarged due to its electrically conductive nature. By incorporating the light-emitting elements 4 with the sensing chip 84 into the light-emitting touch-switch device 20 under the frame segment 32, the touch-sensing area having the touch-sensing function is capable of illuminating light. Besides, by providing the frame segment 32 with the rough bottom surface 321 to be in physical contact with the first circuit board 2 (or to contact the first circuit board 2 via electrically-conductive layer 37), the ohmic contact resistance between the first circuit board 2 and the frame segment 32 can be lowered.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A light-emitting touch-switch device, comprising:
  a first circuit board having a sensing chip electrically coupled thereto;
  a cap unit electrode disposed on and electrically coupled to said first circuit board, said cap unit electrode including a frame segment and a covering segment connected to said frame segment, said frame segment and said covering segment being made of a plastic material that is both light reflective and electrically conductive with a resistance of equal to or smaller than $1 \times 10^5 \Omega$, a top surface of said covering segment remaining exposed for direct touch contact, said frame segment of said cap unit electrode being electrically coupled to said sensing chip to form a touch-sensing element, said cap unit electrode cooperating with said first circuit board to define a receiving space, said cap unit electrode including an interior wall extending from said covering segment of said cap unit electrode to said first circuit board and being electrically coupled thereto to provide a parallel electrically conductive path to the first circuit board for enhancing sensitivity of said touch-sensing element, said interior wall surrounding a portion of said receiving space, said interior wall defining a light-reflective surface; and a light-emitting element disposed within said portion of said receiving space and electrically coupled to said first circuit board, light emitted from said light-emitting element being reflected by said light-reflective surface of said interior wall through at least a portion of said covering segment;

wherein said light-emitting element emits light external to said cap unit electrode upon receipt of a touch-sensing signal generated by said sensing chip when said touch-sensing element detects variation of capacitance of said cap unit electrode as a result of an electrically conductive object being disposed in proximity to or in contact with said cap unit electrode.

2. The light-emitting touch-switch device according to claim 1, wherein said frame segment is in the form of a surrounding wall connected to said first circuit board.

3. The light-emitting touch-switch device according to claim 1, wherein said cap unit electrode further includes a first extending portion extending from said covering segment to a top surface of said first circuit board and electrically connected thereto for enhancing electrical connection between said cap unit electrode and said first circuit board.

4. The light-emitting touch-switch device according to claim 1, wherein said light-emitting touch-switch device comprises said sensing chip, and said sensing chip is disposed on a bottom surface of said first circuit board and is electrically connected to said first circuit board.

5. The light-emitting touch-switch device as claimed in claim 1, further comprising an encapsulation resin filling in said receiving space to encapsulate said light-emitting element.

6. The light-emitting touch-switch device according to claim 1, wherein said first circuit board is formed with a through hole, said cap unit electrode further including a first extending portion extending from said covering segment that engages said through hole.

7. The light-emitting touch-switch device as claimed in claim 1, wherein said first circuit board is formed with a through hole, said light-emitting touch-switch device further comprising a pin inserted into said through hole of said first circuit board so as to electrically connect said cap unit electrode to said first circuit board.

8. The light-emitting touch-switch device according to claim 2, wherein said at least a portion of said covering segment has a light-transmissive pattern area formed therein for permitting light emitted from said light-emitting element to pass therethrough, said light-emitting element being disposed in correspondence with said light-transmissive pattern area.

9. The light-emitting touch-switch device according to claim 2, wherein one of said first circuit board and said frame segment has a rough surface, and said first circuit board and said frame segment are contacting physically through said rough surface.

10. The light-emitting touch-switch device according to claim 2, wherein said first circuit board has a top surface and said frame segment has a rough bottom surface, said light-emitting touch-switch device further comprising an electrically-conductive layer interconnecting said rough bottom surface of said frame segment and said top surface of said first circuit board.

11. The light-emitting touch-switch device according to claim 8, wherein said covering segment, said interior wall and said frame segment are integrally formed as one piece and are made of the same light reflective and electrically conductive plastic material.

12. The light-emitting touch-switch device according to claim 3, further comprising a plurality of supplementary pins connected to said first circuit board and adapted to be engaged with a second circuit board.

13. The light-emitting touch-switch device according to claim 12, wherein said cap unit electrode has a second extending portion configured to extend toward the second circuit board to be in contact therewith, or to extend thereinto.

14. A light-emitting touch-switch module, comprising:
a light-emitting touch-switch device including:
a first circuit board,
a cap unit electrode disposed on said first circuit board and electrically coupled to said first circuit board, said cap unit electrode including a frame segment and a covering segment connected to said frame segment, said frame segment and said covering segment being made of a plastic material that is both light-reflective and electrically conductive with a resistance of equal to or smaller than $1 \times 10^5 \Omega$, a top surface of said covering segment remaining exposed for direct touch contact, said cap unit electrode cooperating with said first circuit board to define a receiving space, said cap unit electrode including an interior wall extending angularly from said covering segment of said cap unit electrode to said first circuit board and being electrically coupled thereto to provide a parallel electrically conductive path to the first circuit board for enhancing sensitivity of said touch-sensing element, said interior wall surrounding a portion of said receiving space, said interior wall defining a light-reflective surface, and
a light-emitting element disposed in said portion of said receiving space and electrically coupled to said first circuit board, light emitted from said light-emitting element being reflected by said light-reflective surface of said interior wall through at least a portion of said covering segment;
a second circuit board connected to said light-emitting touch-switch device;
a sensing chip disposed on one of said first and second circuit boards and electrically coupled to said cap unit electrode such that said sensing chip cooperates with said cap unit electrode to form a touch-sensing element; and
a cover disposed on said second circuit board;
wherein said sensing chip generates a touch-sensing signal when said sensing chip detects variation of capacitance of said cap unit electrode responsive to an electrically conductive object being disposed in proximity to or in contact with said cap unit electrode, said light-emitting element emitting light external to said cap unit electrode upon receipt of the touch-sensing signal from said sensing chip.

15. The light-emitting touch-switch module according to claim 14, wherein said cover is electrically conductive, said light-emitting touch-switch module further comprising a grounding element provided on said second circuit board and electrically coupled to said cover.

16. The light-emitting touch-switch module according to claim 14, further comprising a receiving element interconnecting said cover and said second circuit board, said receiving element being formed with a through hole for receiving said light-emitting touch-switch device.

17. The light-emitting touch-switch module according to claim 15, wherein said second circuit board further includes a metal pad, on which said grounding element is disposed.

18. The light-emitting touch-switch module as claimed in claim 14, wherein said first circuit board is formed with a through hole, said cap unit electrode further includes a first extending portion extending from said covering segment that engages said through hole.

19. The light-emitting touch-switch module according to claim 16, wherein said second circuit board is formed therethrough with an opening registered with said through hole in said receiving element, said light-emitting touch-switch device being at least partially received in said opening and said through hole of said receiving element.

20. The light-emitting touch-switch device according to claim 6, wherein said first circuit board has a hole-defining surface defining said through hole, and a metal layer formed on said hole-defining surface and electrically connecting said first extending portion of said cap unit electrode to said first circuit board.

\* \* \* \* \*